(12) United States Patent
Kiehlbauch (10) Patent No.: US 9,443,756 B2
(45) Date of Patent: *Sep. 13, 2016

(54) METHODS OF FORMING A SUBSTRATE OPENING

(71) Applicant: Micron Technology, Inc., Boise, ID (US)

(72) Inventor: Mark Kiehlbauch, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/674,447

(22) Filed: Mar. 31, 2015

(65) Prior Publication Data

US 2015/0214100 A1    Jul. 30, 2015

Related U.S. Application Data

(63) Continuation of application No. 13/904,933, filed on May 29, 2013, now Pat. No. 9,005,463.

(51) Int. Cl.

| | |
|---|---|
| *H01L 21/32* | (2006.01) |
| *H01L 21/768* | (2006.01) |
| *H01L 21/3065* | (2006.01) |
| *H01L 21/762* | (2006.01) |
| *B81C 1/00* | (2006.01) |
| *G02B 6/136* | (2006.01) |
| *H01L 21/311* | (2006.01) |
| *H01L 21/3213* | (2006.01) |
| *B44C 1/22* | (2006.01) |
| *H01L 21/308* | (2006.01) |

(52) U.S. Cl.
CPC ......... *H01L 21/76804* (2013.01); *B44C 1/227* (2013.01); *B81C 1/00103* (2013.01); *B81C 1/00531* (2013.01); *G02B 6/136* (2013.01); *H01L 21/308* (2013.01); *H01L 21/3065* (2013.01); *H01L 21/3083* (2013.01); *H01L 21/31116* (2013.01); *H01L 21/32* (2013.01); *H01L 21/32136* (2013.01); *H01L 21/32137* (2013.01); *H01L 21/76232* (2013.01); *B81B 2203/033* (2013.01); *B81B 2203/0315* (2013.01); *B81B 2203/0323* (2013.01); *B81B 2203/0338* (2013.01); *B81B 2203/0353* (2013.01)

(58) Field of Classification Search
None
See application file for complete search history.

(56) References Cited

U.S. PATENT DOCUMENTS

| | | |
|---|---|---|
| 5,328,810 A | 7/1994 | Lowrey et al. |
| 5,814,547 A | 9/1998 | Chang |
| 7,189,628 B1 | 3/2007 | Mirbedini et al. |

(Continued)

FOREIGN PATENT DOCUMENTS

| | | |
|---|---|---|
| CN | 101044615 | 9/2007 |
| JP | H06-069605 | 3/1994 |

(Continued)

*Primary Examiner* — Jiong-Pin Lu
(74) *Attorney, Agent, or Firm* — Wells St. John, P.S.

(57) ABSTRACT

A method of forming a substrate opening includes forming a plurality of side-by-side openings in a substrate. At least some of immediately adjacent side-by-side openings are formed in the substrate to different depths relative one another. Walls that are laterally between the side-by-side openings are removed to form a larger opening having a non-vertical sidewall surface where the walls were removed in at least one straight-line vertical cross-section that passes through the sidewall surface orthogonally to the removed walls.

15 Claims, 5 Drawing Sheets

(56) References Cited

U.S. PATENT DOCUMENTS

| | | |
|---|---|---|
| 7,214,625 B2 * | 5/2007 | Asami et al. ............... 438/719 |
| 7,282,401 B2 | 10/2007 | Juengling |
| 7,411,268 B2 | 8/2008 | Karpov et al. |
| 7,442,976 B2 | 10/2008 | Juengling |
| 7,569,454 B2 | 8/2009 | Ozawa |
| 7,915,116 B2 | 3/2011 | Eppich |
| 8,039,340 B2 | 10/2011 | Davis et al. |
| 8,389,353 B2 | 3/2013 | Davis et al. |
| 8,440,515 B2 | 5/2013 | Tang et al. |
| 8,525,201 B2 | 9/2013 | Lee et al. |
| 2002/0004290 A1 | 1/2002 | Gruening et al. |
| 2004/0152288 A1 | 8/2004 | Trogolo et al. |
| 2006/0046407 A1 | 3/2006 | Juengling |
| 2007/0054464 A1 | 3/2007 | Zhang |
| 2007/0117314 A1 | 5/2007 | Ozawa |
| 2007/0141783 A1 | 6/2007 | Peake |
| 2008/0113483 A1 | 5/2008 | Wells |
| 2008/0166856 A1 | 7/2008 | Parekh et al. |
| 2008/0173920 A1 | 7/2008 | Juengling |
| 2008/0258206 A1 | 10/2008 | Hoffmann |
| 2008/0318032 A1 | 12/2008 | Zhu et al. |
| 2009/0035665 A1 | 2/2009 | Tran |
| 2009/0080229 A1 | 3/2009 | Chandra Sekar et al. |
| 2009/0170318 A1 | 7/2009 | Choi |
| 2009/0206443 A1 | 8/2009 | Juengling |
| 2010/0098742 A1 | 4/2010 | Vacanti et al. |
| 2010/0144150 A1 | 6/2010 | Sills et al. |
| 2010/0173470 A1 | 7/2010 | Lee et al. |
| 2010/0203711 A1 * | 8/2010 | Wang et al. ............... 438/478 |
| 2010/0248153 A1 | 9/2010 | Lee et al. |
| 2010/0285646 A1 | 11/2010 | Lin et al. |
| 2011/0169125 A1 | 7/2011 | Reinmuth et al. |
| 2014/0342557 A1 * | 11/2014 | Diem ...................... 438/689 |

FOREIGN PATENT DOCUMENTS

| | | |
|---|---|---|
| JP | 2001-0114592 | 4/2001 |
| JP | 2008-511997 | 4/2008 |
| KR | 10-0831474 | 5/2008 |
| KR | 20100111798 | 10/2010 |
| KR | 10-2011-0061910 | 6/2011 |
| TW | 100107795 | 12/2013 |
| TW | 103116294 | 3/2016 |
| WO | PCT/US2011/024334 | 10/2011 |
| WO | PCT/US2011/024334 | 9/2012 |
| WO | PCT/US2014/035276 | 9/2014 |
| WO | PCT/US2014/035276 | 12/2015 |

* cited by examiner

METHODS OF FORMING A SUBSTRATE OPENING

RELATED PATENT DATA

This patent resulted from a continuation application of U.S. patent application Ser. No. 13/904,933 filed May 29, 2013, entitled "Methods of Forming a Substrate Opening", naming Mark Kiehlbauch as inventor, now U.S. Pat. No. 9,005,463, the disclosure of which is incorporated by reference.

TECHNICAL FIELD

Embodiments disclosed herein pertain to methods of forming openings in substrates.

BACKGROUND

Integrated circuits are commonly formed on a semiconductor substrate such as a silicon wafer or other semiconductive material. In general, layers of various materials which are semiconductive, conductive, or electrically insulative are used to form the integrated circuits. By way of examples, the various materials may be doped, ion implanted, deposited, etched, grown, etc. using various process. A continuing goal in semiconductive processing is to reduce the size of individual electronic components, thereby enabling smaller and denser integrated circuitry.

One technique for patterning and processing semiconductor substrates is lithography. Such may include deposition of a patternable masking layer over underlying substrate material. The masking layer may be patterned to form openings there-through of desired shapes and configurations. The underlying substrate material may be processed through the openings in the masking material (e.g., by ion implanting, etching, etc.) to produce a desired change in the underlying substrate material having or approximating the pattern in the masking layer. The masking layer which may be used may be referred to as resist, with photoresist used in photolithography being one example. In certain instances, multiple different layers of photoresist and/or a combination of photoresist with hard-masking and other materials are used. Further, patterns may be formed on substrates without using resist or photoresist.

DETAILED DESCRIPTION OF EXAMPLE EMBODIMENTS

Figure 1:
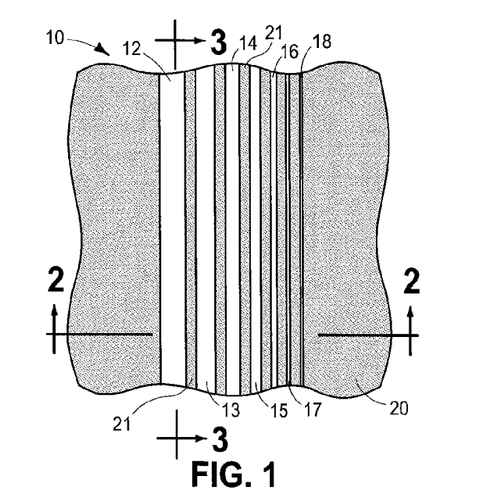
FIG. 1 is a diagrammatic top plan view of a substrate fragment in process in accordance with an embodiment of the invention.
Figure 2:
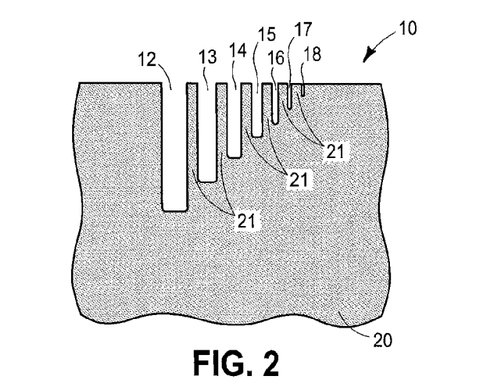
FIG. 2 is a sectional view taken through line 2-2 in FIG. 1.
Figure 3:
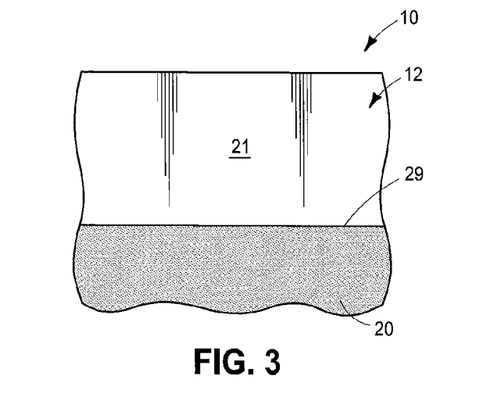
FIG. 3 is a sectional view taken through line 3-3 in FIG. 1.

Initial example embodiments of a method of forming a substrate opening are described with reference to FIGS. 1-6. Methods in accordance with the invention may be used in the fabrication of integrated circuitry, and/or in fabricating other structures. Referring to FIGS. 1-3, a substrate fragment 10 comprises a substrate 20 in which a plurality of side-by-side openings 12, 13, 14, 15, 16, 17, 18 have been formed. In one embodiment, substrate 10 is a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 may include dielectric material and/or electrically conductive material, and regardless need not be a semiconductive substrate. As another example, substrate 10 may comprise sapphire, for example for use in fabricating LEDs and/or other devices.

Material of substrate 20 may be homogenous or non-homogenous. Any of the materials and/or structures described herein may be homogenous or non-homogenous, and regardless may be continuous or discontinuous over any material which such overlie. Further unless otherwise stated, each material may be formed using any suitable or yet-to-be-developed technique, with atomic layer deposition, chemical vapor deposition, physical vapor deposition, epitaxial growth, diffusion doping, and ion implanting being examples. Other partially or wholly fabricated components of integrated circuitry may be formed as a part of or be elevationally inward of the depicted material of substrate 20, and are not particularly germane to the inventions disclosed herein.

Substrate 20 is shown as comprising seven side-by-side openings 12-18, although more or fewer openings may be used. Regardless, at least some of immediately adjacent of the side-by-side openings are formed in substrate 20 to different depths relative one another. Walls 21 are laterally between side-by-side openings 12-18. Immediately adjacent of openings 12-18 may be equally spaced from one another (as shown) whereby walls 21 collectively are of the same lateral width. Alternately as an example, the immediately adjacent openings may include multiple spacings relative one another (not shown), whereby walls 21 collectively have at least two different lateral widths (i.e., at least at an elevationally outermost surface of substrate 20). Walls 21 are shown as extending vertically and being of constant lateral width. Other wall construction may be used. In this document, "horizontal" refers to a general direction along a primary surface relative to which the substrate is processed during fabrication, and "vertical" is a direction generally orthogonal thereto. Further as used herein, "vertical" and "horizontal" are generally perpendicular directions relative one another independent of orientation of the substrate in three-dimensional space. Further in this document, "elevational" and "elevationally" are generally with reference to the vertical direction.

In one embodiment, openings 12-18 are formed using plasma etching, and in one embodiment using only a single masking step to form openings 12-18. Alternately and less ideal, more than one masking step might be used to form side-by-side openings 12-18. In one embodiment, an etch mask (not shown) may be provided over substrate 20. That etch mask may be directly against substrate 20 or not directly against substrate 20. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. The etch mask may comprise a plurality of side-by-side openings where at least some immediately adjacent of such openings have different minimum widths relative one another. For example, in one embodiment, such openings may have the exact size and shape of openings 12-18 in top-down view as shown in FIG. 1. Regardless, the etch mask may be a photomask/reticle provided elevationally over substrate 20, and thereby be spaced from substrate 20. Alternately as an example, the etch mask might comprise photoresist and/or hard masking material(s) deposited atop or forming an elevationally outermost part of substrate 20 and which is processed to have the stated etch mask side-by-side openings.

In one embodiment, plasma etching is then conducted through the side-by-side openings into substrate 20 using the etch mask. The substrate openings that are etched through wider minimum-width openings in the etch mask will be etched deeper into the substrate than the substrate openings etched through narrower minimum-width openings in the etch mask, for example to form a structure as depicted in FIGS. 1-3. As an example, plasma etching may be conducted in an inductively coupled plasma etching reactor using a top-power range of from about 200 Watts to about 1,500 Watts, susceptor/substrate bias from about 10 Watts to about 500 Watts, substrate temperature from about 20° C. to about 100° C., and chamber pressure from about 20 mTorr to about 300 mTorr. When the substrate material being etched comprises silicon nitride, amorphous silicon, and/or crystalline silicon, an example etching chemistry as feed gases includes $SF_6$, $O_2$, HBr at volumetric flow rate ratios of about 0.5 to 2:0.5 to 2:0.5 to 2, respectively, with a ratio of 1:1:1 being a specific example. As further examples, $NF_3$ and/or $CF_4$ may be substituted for $SF_6$, and/or $Cl_2$ may be substituted for HBr. Where the substrate material being etched comprises $SiO_2$, an example etching feed gas chemistry includes $CF_4$ and $O_2$ at example volumetric flow rate ratios of about 0.5 to 2 and 0.5 to 2, respectively, with 1:1 being a specific example. Hydrofluorcarbon(s) may be used in place of or in addition to $CF_4$.

In one embodiment, substrate openings 12-18 are formed to individually be of constant depth (e.g., as shown by the horizontal line of a base 29 of opening 12 in FIG. 3).

Figure 4:
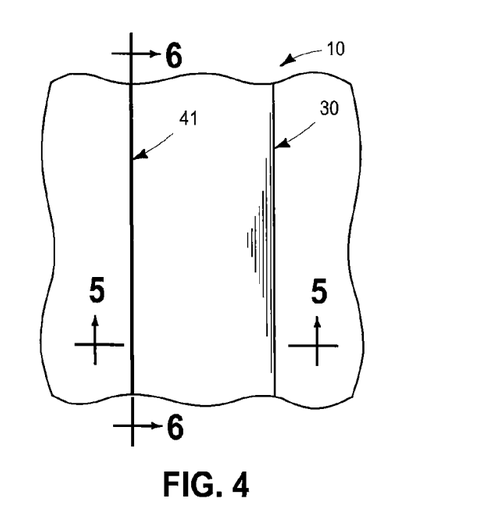
FIG. 4 is a view of the FIG. 1 substrate at a processing step subsequent to that shown by FIG. 1.
Figure 5:
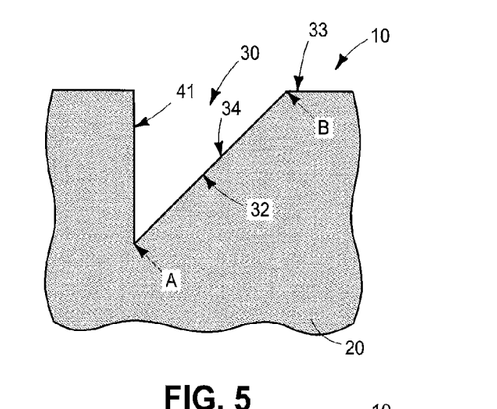
FIG. 5 is a sectional view taken through line 5-5 in FIG. 4.
Figure 6:
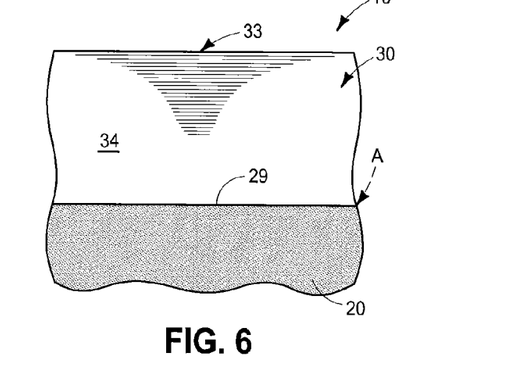
FIG. 6 is a sectional view taken through line 6-6 in FIG. 4.

Referring to FIGS. 4-6, walls 21 (not shown) that were laterally between side-by-side openings 12-18 (not shown) have been removed to form a larger opening 30 (i.e., larger than individual openings 12-18). Larger opening 30 comprises a sidewall 32 having a non-vertical sidewall surface 34 where walls 21 were removed in at least one straight-line vertical cross-section that passes through sidewall surface 34 orthogonally to removed walls 12-18. The cross-sections depicted by FIGS. 2 and 5 are an example of such a straight-line vertical cross-section. Non-vertical sidewall surface 34 in the FIGS. 4-6 embodiment extends between points "A" and "B", and accordingly in one embodiment as shown extends to an elevationally outermost surface 33 of substrate 20 (i.e., after removal of any etch mask that might be directly against or constitute an elevationally outmost material of substrate 20).

In one embodiment, the plurality of side-by-side openings having walls there-between are sub-micron, and in one embodiment the larger opening is sub-micron. In one embodiment, the larger opening is formed to be longitudinally elongated orthogonal the at least one straight-line cross-section, for example as shown in FIGS. 4 and 6.

Removal of the walls to produce a construction like that of FIGS. 4-6 may occur by any existing or yet-to-be-developed manner(s). In one embodiment, the act of removing the walls occurs by etching, for example using wet and/or dry isotropic etching action to remove the walls. In one embodiment, the act of forming the plurality of side-by-side openings having walls there-between comprises etching as does the act of removing those walls. In one such embodiment, the act of forming and the act of removing comprises separate, different chemistry, time-spaced etching steps. Yet in one embodiment where the openings are formed by etching and the walls are removed by etching, the etching of the act of forming the openings and the etching of the act of removing the walls comprises a single continuous etching step from the forming through the removing. For example and by way of example only, consider substrate 20 as shown in FIGS. 1-3 as having an etch mask (e.g., photoresist and/or a hard mask) that is directly against elevationally outermost surfaces of substrate 20. That etch mask might be fabricated to initially have openings corresponding to the openings as appearing in FIG. 1. Plasma etching could be conducted to etch the depicted openings shown in FIGS. 1-3, with the thickness and the material of the etch mask chosen such that continuing of the plasma etching results in removing the walls between the openings of the etch mask (e.g., by lateral etching). Such etching will thereby expose elevationally outermost surfaces of the underlying walls 21 as the etching continues, thereby etching away those walls that are between the side-by-side substrate openings. Etching conditions and materials may be chosen which result in the etch effectively stopping at or near formation of non-vertical sidewall surface 34, with continued etching occurring of the etch mask itself without there necessarily being a separate, time-spaced removal step for etching the walls. Etching conditions, and perhaps chemistry, may be changed later during the continuous etching to achieve greater removal of material of the etch mask than any removal of the etch mask occurring earlier in a continuous act of etching.

Figure 7:
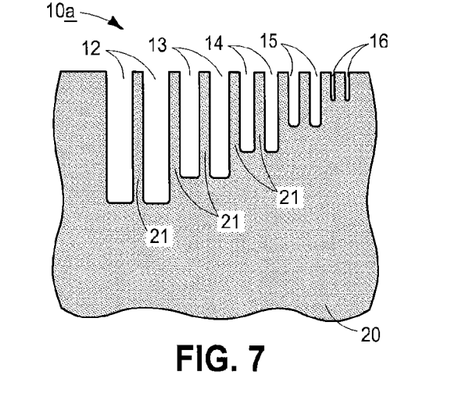
FIG. 7 is a diagrammatic sectional view of an alternate substrate fragment in process in accordance with an embodiment of the invention.
Figure 8:
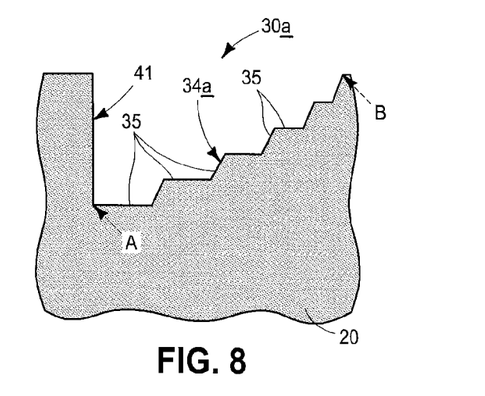
FIG. 8 is a view of the FIG. 7 substrate at a processing step subsequent to that shown by FIG. 7.

FIGS. 1-3 show an example embodiment wherein each immediately adjacent of side-by-side openings 12-18 is of different depth in the substrate relative each other. Specifically, in each immediately adjacent pair of openings 12/13, 13/14, 14/15, 15/16, 16/17, 17/18, each opening is of different depth in the substrate in each pair. Further, FIGS. 1-3 show an example embodiment wherein all side-by-side openings 12-18 are of different depths relative one another (i.e., no two of openings 12-18 have the same depth within substrate 20). In an alternate embodiment, only some of immediately adjacent side-by-side openings are formed in the substrate to different depths relative one another, for example as shown by alternate substrate fragment 10a in FIG. 7. Like numerals from the above-described embodiment have been used where appropriate, with some construction differences being indicated with the suffix "a". For example, substrate fragment 10a has immediately adjacent pairs of individual openings 12, 13, 14, 15, 16 of the same depth relative substrate 20, with the depths between immediately adjacent substrate openings 12/13, 13/14, 14/15, 15/16 being different relative each other. FIG. 8 shows subsequent removal of walls 21 (not shown) of FIG. 7, thereby forming non-vertical sidewall surface 34a where the walls were removed. Any other attribute(s) as described above may be employed.

FIGS. 4-6 show an example embodiment wherein non-vertical sidewall surface 34 is formed to be straight-linear along at least a majority (i.e., more than 50%) of its length along the straight-line vertical cross-section as shown in FIG. 5. In one embodiment and as also shown in FIG. 5, non-vertical sidewall surface 34 is straight-linear along substantially all (i.e., more than 95%) of its length in the straight-line vertical cross-section. FIG. 8 depicts an alternate embodiment wherein non-vertical sidewall surface 34a of larger opening 30a is not straight-linear along a majority of its length, rather for example having the depicted differently angled sections 35. Any other attribute(s) as described above may be employed.

Figure 9:
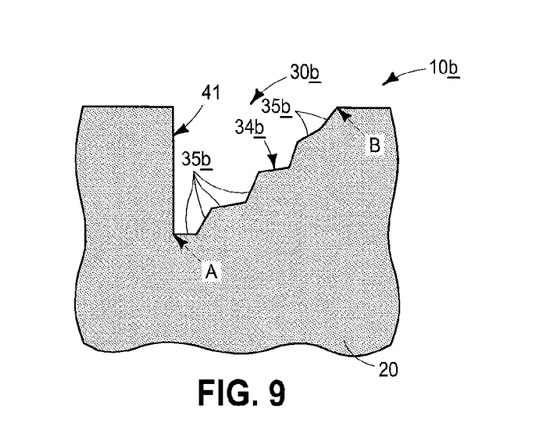
FIG. 9 is a diagrammatic sectional view of an alternate substrate fragment in process in accordance with an embodiment of the invention.

FIG. 8 also depicts an example embodiment wherein non-vertical sidewall surface 34a is formed to have a combination of differently angled straight-linear sections 35, for example the depicted horizontal angled sections and the depicted upwardly/downwardly angled sections which are at substantially the same angle relative one another (e.g., only two different angles from vertical overall). FIG. 9 shows an alternate embodiment substrate fragment 10b to that of FIG. 8. Like numerals from the above-described embodiments have been used where appropriate, with some construction differences being indicated with the suffix "b". In FIG. 9, non-vertical sidewall surface 34b of larger opening 30b has more than two differently angled sections 35b. Such could be formed from appropriate depth side-by-side openings analogous to, and slightly different from, those of FIG. 7. Any other attribute(s) as described above may be employed.

Figure 10:
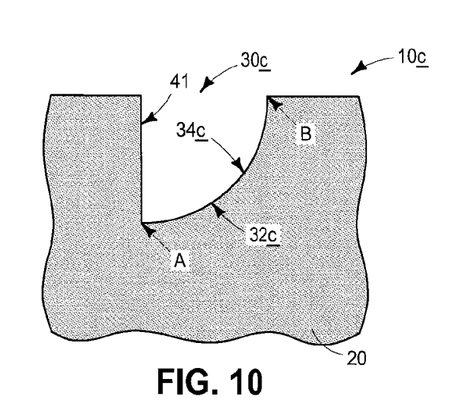
FIG. 10 is a diagrammatic sectional view of an alternate substrate fragment in process in accordance with an embodiment of the invention.
Figure 11:
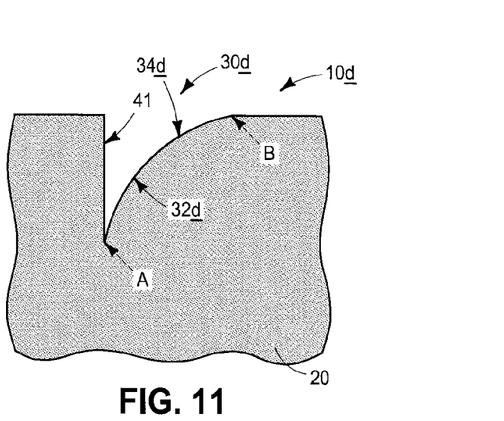
FIG. 11 is a diagrammatic sectional view of an alternate substrate fragment in process in accordance with an embodiment of the invention.

Accordingly, a non-vertical sidewall surface of the larger opening may be of any desired configuration by varying the depths of initially-formed side-by-side openings. For further example, the non-vertical sidewall surface may be formed to be curved along at least a majority of its length along the straight-line vertical cross-section, and in one embodiment along substantially all of its length. Example such embodiments are shown in FIGS. 10 and 11 with respect to substrate fragments 10c and 10d, respectively. Like numerals from the above-described embodiments have been used where appropriate, with some construction differences being indicated with the suffix "c" and the suffix "d", respectively. Substrate fragment 10c includes a larger opening 30c. Sidewall 32c thereof includes a non-vertical concave sidewall surface 34c. Substrate fragment 10d includes a larger opening 30d. Sidewall 32d thereof includes a non-vertical convex sidewall surface 34d. Any other attribute(s) as described above may be employed.

Figure 12:
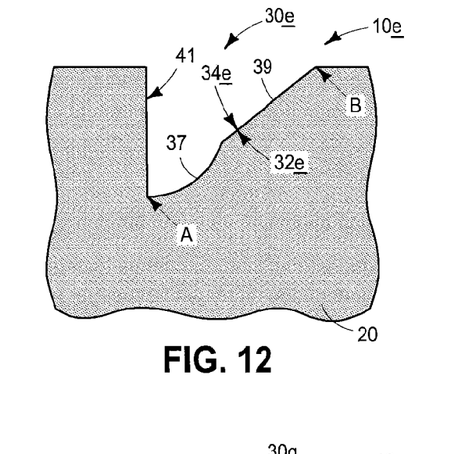
FIG. 12 is a diagrammatic sectional view of an alternate substrate fragment in process in accordance with an embodiment of the invention.

In one embodiment, the non-vertical sidewall surface is formed to have a combination of at least one straight-linear section and at least one curved section, for example as shown with respect to a substrate fragment 10e in FIG. 12. Like numerals from the above-described embodiments have been used where appropriate, with some construction differences being indicated with the suffix "e". Larger opening 30e includes a sidewall 32e having a non-vertical sidewall surface 34e having a straight-linear section 39 and a curved section 37. Any other attribute(s) as described above may be employed.

Figure 13:
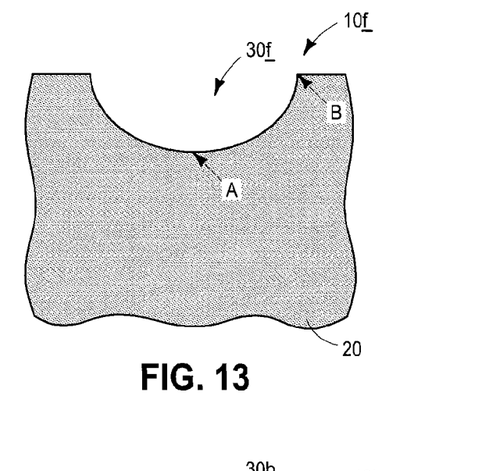
FIG. 13 is a diagrammatic sectional view of an alternate substrate fragment in process in accordance with an embodiment of the invention.

The above described embodiments of FIGS. 4-6; 8; 9; 10; 11, and 12 show examples wherein the larger opening is formed to comprise a vertical sidewall surface 41 that is laterally opposite the non-vertical sidewall surface 34, 34a, 34b, 34c, 34d, or 34e in the depicted straight-line vertical cross-section. In one embodiment, the larger opening may be formed to be devoid of any vertical sidewall surface laterally opposite the non-vertical sidewall surface, and in one embodiment to be devoid of any vertical surface. For example, FIG. 13 depicts an alternate embodiment substrate fragment 10f. Like numerals from the above-described embodiments have been used where appropriate, with some construction differences being indicated with the suffix "f". Substrate fragment 10f has larger opening 30f which is both devoid of any vertical sidewall surface laterally opposite a non-vertical sidewall surface, and devoid of any vertical surface. Any other attribute(s) as described above may be employed.

Figure 14:
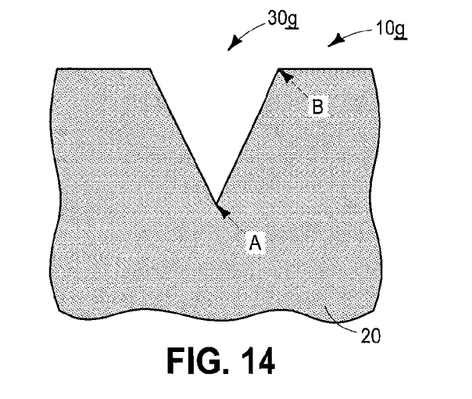
FIG. 14 is a diagrammatic sectional view of an alternate substrate fragment in process in accordance with an embodiment of the invention.
Figure 15:
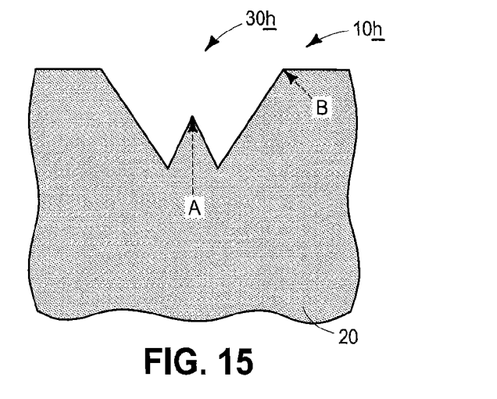
FIG. 15 is a diagrammatic sectional view of an alternate substrate fragment in process in accordance with an embodiment of the invention.

FIGS. 14 and 15 depict further example such alternate embodiment substrate fragments 10g, 10h, respectively. Like numerals from the above-described embodiments have been used where appropriate, with some construction differences being indicated with the suffix "g" and "h", respectively. In FIG. 14, substrate fragment 10g has larger opening 30g formed to be "V"-shaped in the depicted straight-line vertical cross-section. In FIG. 15, substrate fragment 10*h* has larger opening 30*h* formed to be "W"-shaped in the depicted straight-line vertical cross-section. Other shapes may be used. Any other attribute(s) as described above may be employed.

Figure 16:
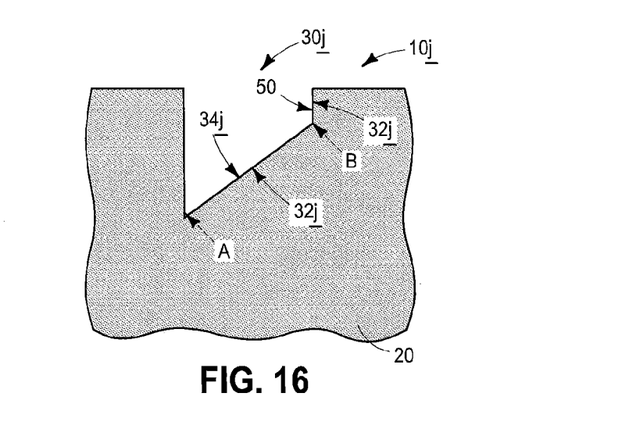
FIG. 16 is a diagrammatic sectional view of an alternate substrate fragment in process in accordance with an embodiment of the invention.

In one embodiment, the larger opening is formed to comprise an elevationally outermost sidewall surface that is vertical and which joins with the non-vertical sidewall surface. Such an example substrate fragment 10*j* is shown in FIG. 16. Like numerals from the above-described embodiments have been used where appropriate, with some construction differences being indicated with the suffix "j" or with different numerals. Larger opening 30*j* comprises a sidewall 32*j* having an elevationally outermost sidewall surface 50 that is vertical and which joins with a non-vertical sidewall surface 34*j*. Any other attribute(s) as described above may be employed.

Figure 17:
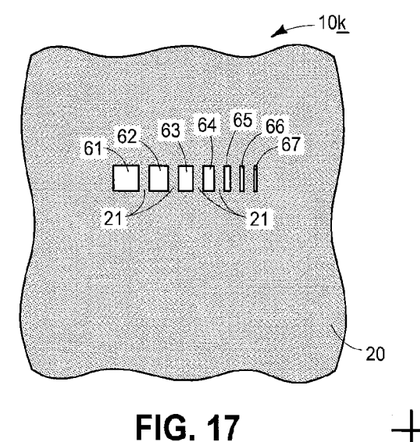
FIG. 17 is a diagrammatic top plan view of an alternate substrate fragment in process in accordance with an embodiment of the invention

In one embodiment, all of the side-by-side openings are formed to be longitudinally elongated orthogonal to the straight-line vertical cross-section, for example as is inherent in viewing the top-down view of FIG. 1. In one embodiment, at least one of the side-by-side substrate openings is formed to not be longitudinally elongated. Such is shown for example in FIG. 17 with respect to a substrate fragment 10*k*. Like numerals from the above-described embodiments have been used where appropriate, with some construction differences being indicated with the suffix "k" or different numerals. Substrate fragment 10*k* has side-by-side substrate openings 61, 62, 63, 64, 65, 66, 67 having walls 21 therebetween. Substrate opening 61 is formed as shown to be square, thereby not being longitudinally elongated for example in comparison to each of openings 62-67 which are longitudinally elongated (e.g., rectangular). Alternately, one or more of openings 62-67 may be square (not shown). Any other attribute(s) as described above may be employed.

Figure 18:
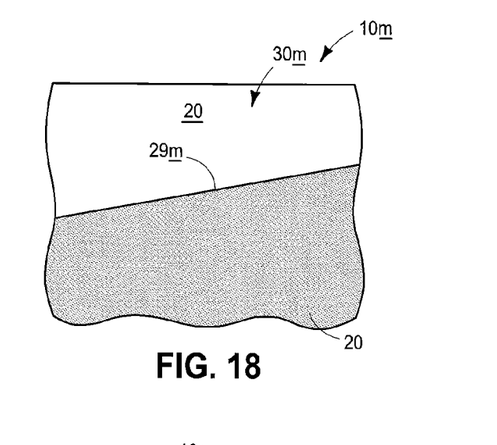
FIG. 18 is a diagrammatic sectional view of an alternate substrate fragment in process in accordance with an embodiment of the invention.

The above example embodiment of FIGS. 4-6 depicts larger opening 30 as being formed to have a horizontal base surface 29 (FIG. 6) orthogonal to the straight-line vertical cross-section that passes through the sidewall surface orthogonal to the removed walls (FIGS. 4 and 5). In one embodiment and as shown, horizontal base surface 29 extends along substantially all (i.e., at least 95%) of the larger opening orthogonal to the stated straight-line vertical cross-section. Alternately, the larger opening may be formed to have some non-horizontal base surface orthogonal to the straight-line vertical cross-section, for example as shown in FIG. 18 with respect to a substrate fragment 10*m*. Like numerals from the above-described embodiments have been used where appropriate, with some construction differences being indicated with the suffix "m". FIG. 18 corresponds in position to that of FIG. 6. Larger opening 30*m* of substrate fragment 10*m* is shown as having a non-horizontal base surface 29*m* orthogonal to the stated straight-line vertical cross-section (e.g., like that of the cross-section of FIG. 5), and which extends along substantially all of the larger opening orthogonal to the stated straight-line vertical cross-section. Any other attribute(s) as described above may be employed.

Figure 19:
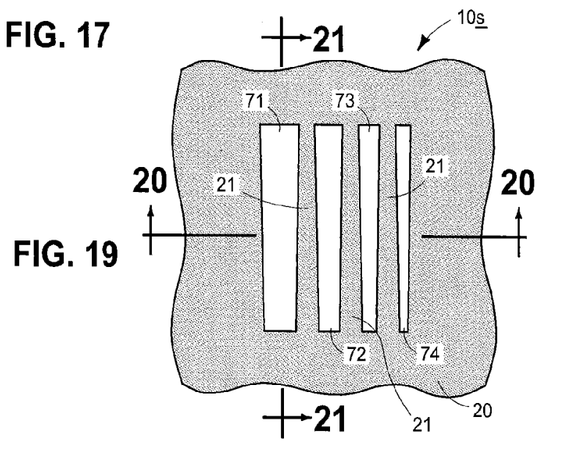
FIG. 19 is a diagrammatic top plan view of an alternate substrate fragment in process in accordance with an embodiment of the invention.
Figure 20:
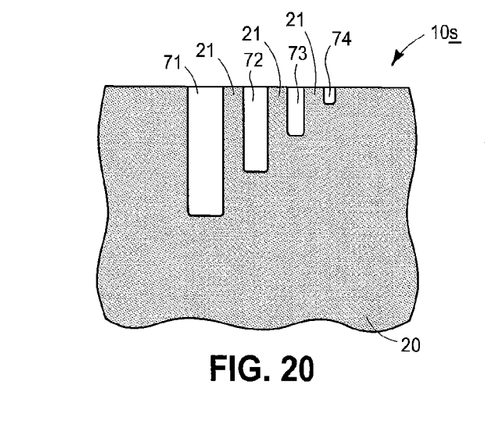
FIG. 20 is a sectional view taken through line 20-20 in FIG. 19.
Figure 21:
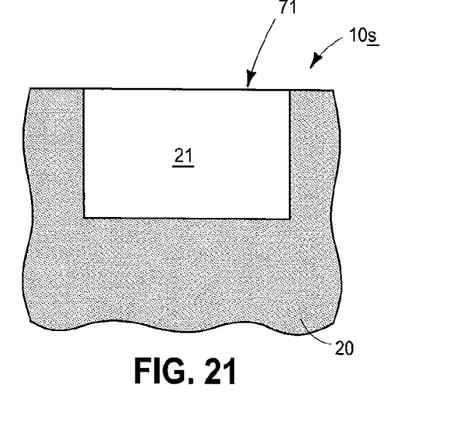
FIG. 21 is a sectional view taken through line 21-21 in FIG. 19.

Formation of such non-horizontal base surfaces may be achieved in any suitable manner. In one such embodiment, the side-by-side substrate openings may be formed to individually have multiple different outermost open dimensions, for example as shown with respect to an alternate embodiment substrate fragment 10*s* in FIGS. 19-21. Like numerals from the above-described embodiments have been used where appropriate, with some construction differences being indicated with the suffix "s" or with different numerals. Substrate fragment 10*s* has side-by-side openings 71, 72, 73, 74 formed in substrate 20. Such individually have multiple different outermost open dimensions, for example with each being shown as having tapered sidewalls in top-down view (FIG. 19).

Figures 22, 23, 24:
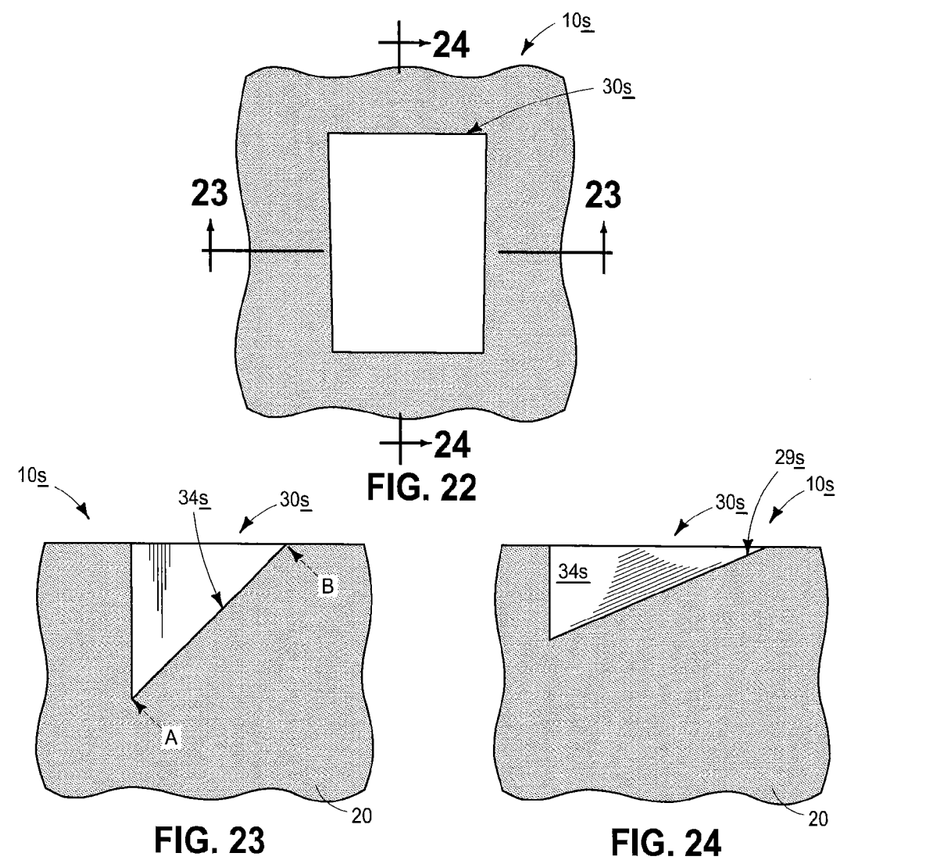
FIG. 22 is a view of the FIG. 19 substrate at a processing step subsequent to that shown by FIG. 19.
FIG. 23 is a sectional view taken through line 23-23 in FIG. 22.
FIG. 24 is a sectional view taken through line 24-24 in FIG. 22.

Referring to FIGS. 22-24, walls 21 (not shown) have been removed to form a larger opening 30*s* having a non-vertical sidewall surface 34*s* where the walls are removed in the depicted FIG. 23 straight-line vertical cross-section. FIG. 24 shows base 29*s* of larger opening 30*s* being non-horizontal. This may result from openings 71, 72, 73, 74 in FIGS. 19-21 being wider at one longitudinal end than the other, thereby forming larger opening 30*s* to be deeper in substrate 20 at the wider ends versus the narrower ends. Any other attribute(s) as described above may be employed.

Figure 25:
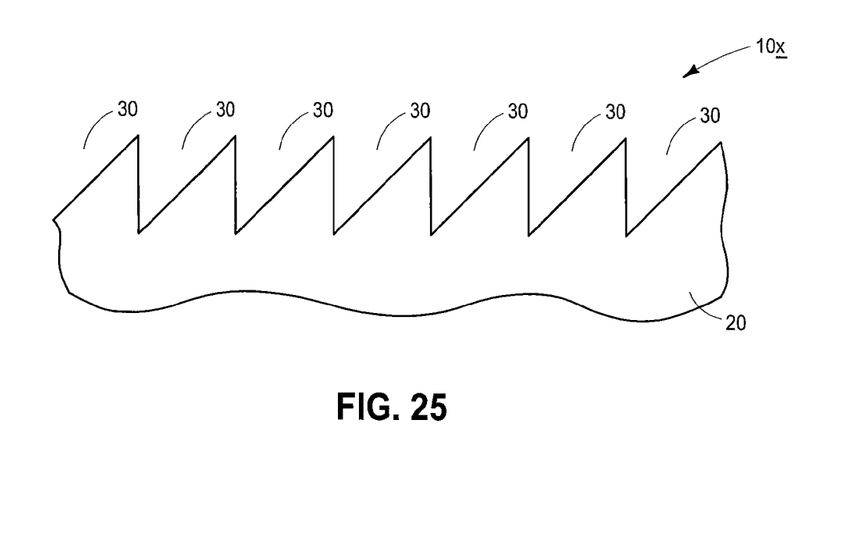
FIG. 25 is a diagrammatic sectional view of an alternate substrate fragment in process in accordance with an embodiment of the invention.

The above depicted embodiments show only a single larger opening in the depicted views. Likely hundreds, thousands, or more such openings might be formed. Further, those large openings might be oriented parallel or otherwise relative one another, and of any spacing relative one another. FIG. 25 shows an alternate embodiment substrate fragment 10*x* having a series of closely spaced larger openings 30 formed therein. Like numerals from the above-described embodiments have been used where appropriate, with some construction differences being indicated with the suffix "x". Any other attribute(s) as described above may be employed. Regardless, structures formed in accordance with embodiments of the invention may be used in any existing or yet-to-be-developed apparatus. For example, the larger openings may be used as optical or other wave guides or in ferroelectric-liquid-crystal-on-silicon (FLCOS) devices.

CONCLUSION

In some embodiments, a method of forming a substrate opening comprises forming a plurality of side-by-side openings in a substrate. At least some of immediately adjacent side-by-side openings are formed in the substrate to different depths relative one another. Walls that are laterally between the side-by-side openings are removed to form a larger opening having a non-vertical sidewall surface where the walls were removed in at least one straight-line vertical cross-section that passes through the sidewall surface orthogonally to the removed walls.

In some embodiments, a method of forming a substrate opening comprises providing an etch mask over a substrate. The etch mask comprises a plurality of side-by-side openings. At least some immediately adjacent side-by-side openings have different minimum widths relative one another. A plurality of side-by-side openings is plasma etched into the substrate using the etch mask. The substrate openings that are etched though wider minimum-width openings in the etch mask are etched deeper into the substrate than the substrate openings that are etched through narrower minimum-width openings in the etch mask. Walls that are laterally between the side-by-side substrate openings are removed to form a larger opening having a non-vertical sidewall surface where the walls were removed in at least one straight-line vertical cross-section that passes through the sidewall surface orthogonally to the removed walls.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a substrate opening, comprising:
forming a plurality of side-by-side openings in a substrate, at least some of immediately adjacent side-by-side openings being formed in the substrate to different depths relative one another; and
removing walls that are laterally between the side-by-side openings to form a larger opening having a non-vertical sidewall surface where the walls were removed in at least one straight-line vertical cross-section that passes through the sidewall surface orthogonally to the removed walls, the non-vertical sidewall surface being formed to be straight-linear along substantially all of its length along the at least one straight-line vertical cross-section to an elevationally outermost surface of the substrate.

2. The method of claim 1 wherein each immediately adjacent side-by-side opening having the walls there-between is of different depth in the substrate relative each other.

3. The method of claim 2 wherein all side-by-side openings having the walls there-between are of different depths relative one another.

4. A method of forming a substrate opening, comprising:
forming a plurality of side-by-side openings in a substrate, at least some of immediately adjacent side-by-side openings being formed in the substrate to different depths relative one another; and
removing walls that are laterally between the side-by-side openings to form a larger opening having a laterally-outermost non-vertical sidewall surface where the walls were removed in at least one straight-line vertical cross-section that passes through the laterally-outermost sidewall surface orthogonally to the removed walls, the laterally-outermost non-vertical sidewall surface being formed to extend from a deepest point of the larger opening to have a combination of at least two differently angled non-vertical straight-linear sections.

5. A method of forming a substrate opening, comprising:
forming a plurality of side-by-side openings in a substrate using masking material that is directly against the substrate, at least some of immediately adjacent side-by-side openings being formed in the substrate to different depths relative one another; and
removing walls below the masking material that are laterally between the side-by-side openings to form a larger opening having a non-vertical sidewall surface where the walls were removed in at least one straight-line vertical cross-section that passes through the sidewall surface orthogonally to the removed walls, the larger opening being larger below the masking material than it was before removing the walls, the non-vertical sidewall surface extending to an elevationally outermost surface of the substrate that is immediately below the masking material.

6. A method of forming a substrate opening, comprising:
forming a plurality of side-by-side openings in a substrate, at least some of immediately adjacent side-by-side openings being formed in the substrate to different depths relative one another; and
removing walls that are laterally between the side-by-side openings to form a larger opening having a non-vertical sidewall surface where the walls were removed in at least one straight-line vertical cross-section that passes through the sidewall surface orthogonally to the removed walls, the substrate openings having the walls there-between being formed to individually have multiple different maximum outermost open dimensions, and the larger opening is formed to have a non-horizontal base surface orthogonal to the one straight-line vertical cross-section.

7. The method of claim 6 wherein the substrate openings having the walls there-between that individually have multiple different maximum outermost open dimensions are individual trapezoidal in shape.

8. A method of forming a substrate opening, comprising:
forming a plurality of side-by-side openings in a substrate, at least some of immediately adjacent side-by-side openings being formed in the substrate to different depths relative one another; and
removing walls that are laterally between the side-by-side openings to form a larger opening having a non-vertical sidewall surface where the walls were removed in at least one straight-line vertical cross-section that passes through the sidewall surface orthogonally to the removed walls, the forming comprising etching and the removing comprising etching, the etching of the forming and the etching of the removing comprising a single continuous etching step from the forming through the removing, the non-vertical sidewall surface being formed to be curved along substantially all of its length along the at least one straight-line vertical cross-section, the non-vertical sidewall surface being formed to be convex.

9. A method of forming a substrate opening, comprising:
forming a plurality of side-by-side openings in a substrate, at least some of immediately adjacent side-by-side openings being formed in the substrate to different depths relative one another; and
removing walls that are laterally between the side-by-side openings to form a larger opening having a non-vertical sidewall surface where the walls were removed in at least one straight-line vertical cross-section that passes through the sidewall surface orthogonally to the removed walls, the non-vertical sidewall surface being formed to be entirely convex.

10. The method of claim 9 wherein each immediately adjacent side-by-side opening having the walls there-between is of different depth in the substrate relative each other.

11. The method of claim 10 wherein all side-by-side openings having the walls there-between are of different depths relative one another.

12. The method of claim 9 wherein the plurality of side-by-side openings having walls there-between are sub-micron, and the larger opening is sub-micron.

13. The method of claim 9 wherein all of the substrate openings having the walls there-between are formed to be longitudinally elongated orthogonal to the straight-line vertical cross section.

14. The method of claim 9 wherein at least one of the substrate openings having the walls there-between is formed to not be longitudinally elongated.

15. A method of forming a substrate opening, comprising:
forming a plurality of side-by-side openings in a substrate, at least some of immediately adjacent side-by-side openings being formed in the substrate to different depths relative one another; and
removing walls that are laterally between the side-by-side openings to form a larger opening having a non-vertical sidewall surface where the walls were removed in at least one straight-line vertical cross-section that passes through the sidewall surface orthogonally to the removed walls, the non-vertical sidewall surface being formed to be convex and extend to an elevationally outermost surface of the substrate.

\* \* \* \* \*